US009490272B2

United States Patent
Nagayama

(10) Patent No.: US 9,490,272 B2
(45) Date of Patent: Nov. 8, 2016

(54) ARRAY SUBSTRATE AND DISPLAY DEVICE

(71) Applicant: BOE Technology Group Co., Ltd., Beijing (CN)

(72) Inventor: Kazuyoshi Nagayama, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/441,960

(22) PCT Filed: Sep. 20, 2014

(86) PCT No.: PCT/CN2014/086998
§ 371 (c)(1),
(2) Date: May 11, 2015

(87) PCT Pub. No.: WO2015/172491
PCT Pub. Date: Nov. 19, 2015

(65) Prior Publication Data
US 2015/0357347 A1    Dec. 10, 2015

(30) Foreign Application Priority Data
May 16, 2014 (CN) .......................... 2014 1 0208869

(51) Int. Cl.
H01L 27/12     (2006.01)
G02F 1/1368    (2006.01)

(52) U.S. Cl.
CPC .......... H01L 27/124 (2013.01); G02F 1/1368 (2013.01); H01L 27/1225 (2013.01)

(58) Field of Classification Search
CPC ............. H01L 27/124; H01L 27/1225; H01L 27/1218; H01L 27/3248; H01L 27/326; G02F 1/1368
See application file for complete search history.

(56) References Cited

U.S. PATENT DOCUMENTS

| 6,020,214 A | 2/2000 | Watanabe et al. |
| 6,310,668 B1 | 10/2001 | Ukita |
| 6,897,908 B2 * | 5/2005 | Lee .................... G02F 1/136213 257/E27.111 |
| 2004/0075781 A1 | 4/2004 | Sohn |

(Continued)

FOREIGN PATENT DOCUMENTS

| CN | 1490652 A | 4/2004 |
| CN | 102956714 A | 3/2013 |

(Continued)

OTHER PUBLICATIONS

Dec. 25, 2014—(CN) First Office Action—App 201410208869.5.

(Continued)

Primary Examiner — Whitney T Moore
(74) Attorney, Agent, or Firm — Banner & Witcoff, Ltd.

(57) ABSTRACT

An array substrate includes a gate line, a data line and a plurality of pixel units defined by the gate line and the data line intersecting with each other, which are formed on a base substrate, and each pixel unit includes a thin film transistor. The farther the thin film transistor is away from a gate driver side of the array substrate, the more likely an overlapping area between an active layer and a source electrode of the thin film transistor shows an increasing trend. By changing the overlapping area between the active layer and the source electrode, a dielectric constant between a gate electrode and the source electrode increases to enlarge a gate-source capacitance Cgs, leading to an increase of ΔVp; as a result, a common electrode voltage tends to be stable, thus avoiding crosstalk at the time of displaying.

9 Claims, 2 Drawing Sheets

(56) References Cited

U.S. PATENT DOCUMENTS

2006/0290630 A1 12/2006 Kim et al.
2009/0033817 A1 2/2009 Ooida et al.

FOREIGN PATENT DOCUMENTS

| CN | 103715095 A | 4/2014 |
|----|-------------|--------|
| KR | 100767631 B1 | 10/2007 |
| KR | 20080001782 A | 1/2008 |
| TW | 594347 B | 6/2004 |

OTHER PUBLICATIONS

Apr. 1, 2015—(CN) Notice of Allowance—App 201410208869.5.
Jan. 21, 2015—(WO) International Search Report and Written Opinion PCT/CN2014/086988 with Eng Tran.

\* cited by examiner

ARRAY SUBSTRATE AND DISPLAY DEVICE

The application is a U.S. National Phase Entry of International Application No. PCT/CN2014/086998 filed on Sep. 20, 2014, designating the United States of America and claiming priority to Chinese Patent Application No. 201410208869.5 filed on May 16, 2014. The present application claims priority to and the benefit of the above-identified applications and the above-identified applications are incorporated by reference herein in their entirety.

TECHNICAL FIELD

Embodiments of the invention relate to an array substrate and a display device.

BACKGROUND

Due to a size of a display panel, gate delays (also referred to as RC delay) in different positions are different, so a common electrode voltage Vcom is different in different locations. As illustrated in FIG. 1, the farther a gate line is away from a gate driver (Y PCB in the diagram), the greater the gate delay is; the common electrode voltage Vcom at point ② is greater than that at point ①, that is, the farther the gate line is from the gate driver, the larger the common electrode voltage Vcom will be. Thus, for each pixel, the common electrode voltage Vcom is not stable, which can cause crosstalk at the time of displaying. Actually, Vcom=−ΔVp, where ΔVp is a transition voltage of a pixel voltage Vp caused by a disconnection of the gate line, and V is a common voltage of an actual input; it can be seen that ΔVp could be increased to keep the common electrode voltage Vcom stable.

SUMMARY OF THE INVENTION

According to an embodiment of the present invention, there is provided an array substrate, comprising a gate line, a data line and a plurality of pixel units defined by the gate line and the data line intersecting with each other, which are formed on a base substrate, the plurality of pixel units being arranged in matrix along a row direction and a column direction, and each pixel unit including a thin film transistor, wherein, one side in the row direction of the array substrate is a gate driver side for arranging a gate driver, in each row of pixel units, an overlapping area between an active layer and a source electrode of a thin film transistor in a pixel unit farther away from the gate driver side of the array substrate is greater than or equal to an overlapping area between an active layer and a source electrode of a thin film transistor in a pixel unit closer to the gate driver side of the array substrate, and an overlapping area between an active layer and a source electrode of a thin film transistor in at least one pixel unit is greater than an overlapping area between an active layer and a source electrode of a thin film transistor in a pixel unit which is closer to the gate driver side than the at least one pixel unit.

In one example, in a same column, overlapping areas between active layers and source electrodes of thin film transistors in respective pixel units are equal.

In one example, the pixel units are divided into n groups by columns, where $1 < n \leq N$, and N is a total number of columns; from a first column of pixels near the gate driver side of the array substrate, an overlapping area between an active layer and a source electrode of a thin film transistor in a $(i+1)^{th}$ group of pixel units is greater than an overlapping area between an active layer and a source electrode of a thin film transistor in a $i^{th}$ group of pixel units by $\Delta S_i$, where $1 \leq i \leq n-1$; and overlapping areas between active layers and source electrodes of thin film transistors in a same group are equal.

In one example, respective groups of pixel units have a same number of columns.

In one example, in each row of pixel units, an overlapping area between an active layer and a drain electrode of a thin film transistor in a pixel unit farther away from the gate driver side of the array substrate is less than or equal to an overlapping area between an active layer and a drain electrode of a thin film transistor in a pixel unit closer to the gate driver side of the array substrate, and an overlapping area between an active layer and a drain electrode of a thin film transistor in at least one pixel unit is less than an overlapping area between an active layer and a drain electrode of a thin film transistor in a pixel unit which is closer to the gate driver side than the at least one pixel unit.

In one example, in a same column, overlapping areas between active layers and drain electrodes of thin film transistors in respective pixel units are equal.

In one example, the pixel units are divided into m groups by columns, where $1 < m \leq N$, and N is a total number of columns; from a first column of pixels near the gate driver side of the array substrate, an overlapping area between an active layer of a thin film transistor in a $(j+1)^{th}$ group of pixel units and the data line is less than an overlapping area between an active layer of a thin film transistor in a $j^{th}$ group of pixel units and the data line by $\Delta S_j$, where $1 \leq j \leq m-1$; and overlapping areas between active layers of thin film transistors and the data line in a same group are equal.

In one example, respective groups of pixel units have a same number of columns.

In one example, m=n.

In one example, when i=j, $\Delta S_i = \Delta S_j$.

In one example, the active layer has a material of oxide semiconductor.

According to another embodiment of the present invention, there is provided a display device, comprising the array substrate according to any of the preceding embodiments.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An array substrate according to an embodiment of present invention, comprises a gate line 210, a data line 220 and a plurality of pixel units defined by the gate line and the data line intersecting with each other, which are formed on a base substrate, and each pixel unit includes a thin film transistor. The plurality of pixel units are arranged in matrix along a row direction and a column direction. One side in the row direction of the array substrate is a gate driver side for arranging a gate driver, which does not mean that the gate driver is necessarily a certain part of the array substrate, and the gate driver may be a part provided separately from the array substrate. However, in some embodiments, the gate driver can also be provided on the array substrate, e.g., the array substrate of GOA structure.

Figure 2:
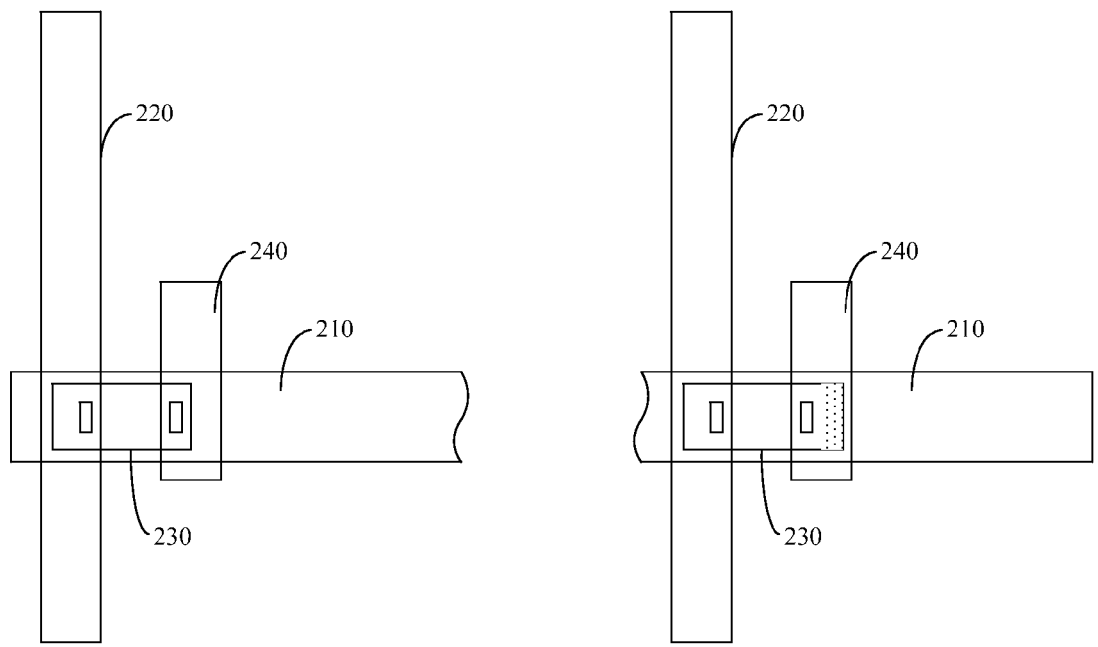
FIG. 2 is a structural schematic diagram of an array substrate (a simple structure of two pixels at different positions in a same row is illustrated) according to an embodiment of the present invention.

In order to stabilize the common electrode voltage Vcom, as illustrated in FIG. 2, the farther the thin film transistor is away from the gate driver side of the array substrate, the more likely the overlapping area between an active layer 230 and a source electrode 240 of the thin film transistor shows an increasing trend. "An increasing trend" refers to an overlapping area between an active layer and a source electrode of a thin film transistor in a pixel unit farther away from the gate driver side of the array substrate is greater than or equal to an overlapping area between an active layer and a source electrode of a thin film transistor in a pixel unit closer to the gate driver side of the array substrate, and an overlapping area between an active layer and a source electrode of a thin film transistor in at least one pixel unit is greater than an overlapping area between an active layer and a source electrode of a thin film transistor in a pixel unit which is closer to the gate driver side than the at least one pixel unit.

Due to feed-in characteristics (the feed-in is just a process of generating ΔVp, which is caused by a hopping of a gate voltage in the display), ΔVp will have a relatively large offset compared to a theoretical value; and a factor of greatest impact in causing such a fluctuation is a gate-source capacitance $C_{gs}$, whose influence to ΔVp can be seen in FIG. 3 and formula (1) below; and thus, it is very important to control $C_{gs}$ voltage to maintain stability of ΔVp. As well known, $C_{gs}$ is caused by an overlapping between a gate layer and the source layer. In the formula C=∈S/d, where S is an overlapping area of parallel plates, ∈ is a dielectric constant of medium, and d is a distance between the parallel plates; and a magnitude of the capacitance is controlled by changing a magnitude of ∈ in the present embodiment.

$$\Delta Vp = \frac{C_{gs}}{C_{all}}(V_{gh} - V_{gl}) \quad (1)$$

Figure 1:
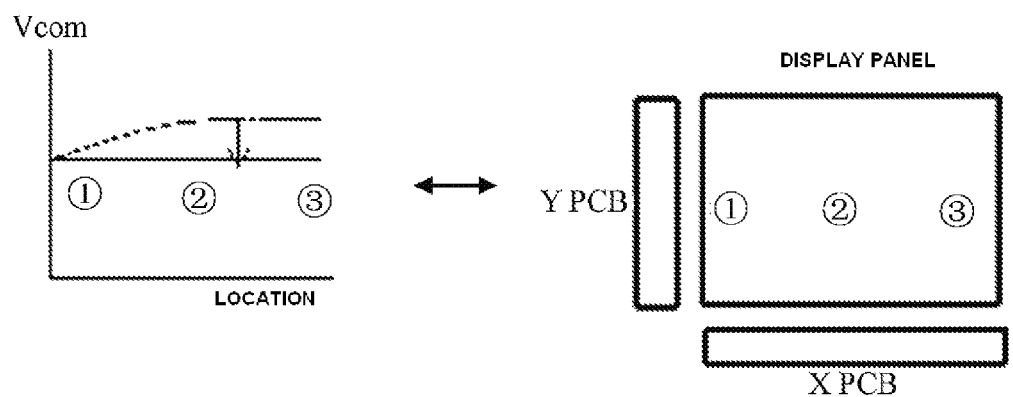
FIG. 1 is a graph showing Vcom in different positions of a display panel.
Figure 3:
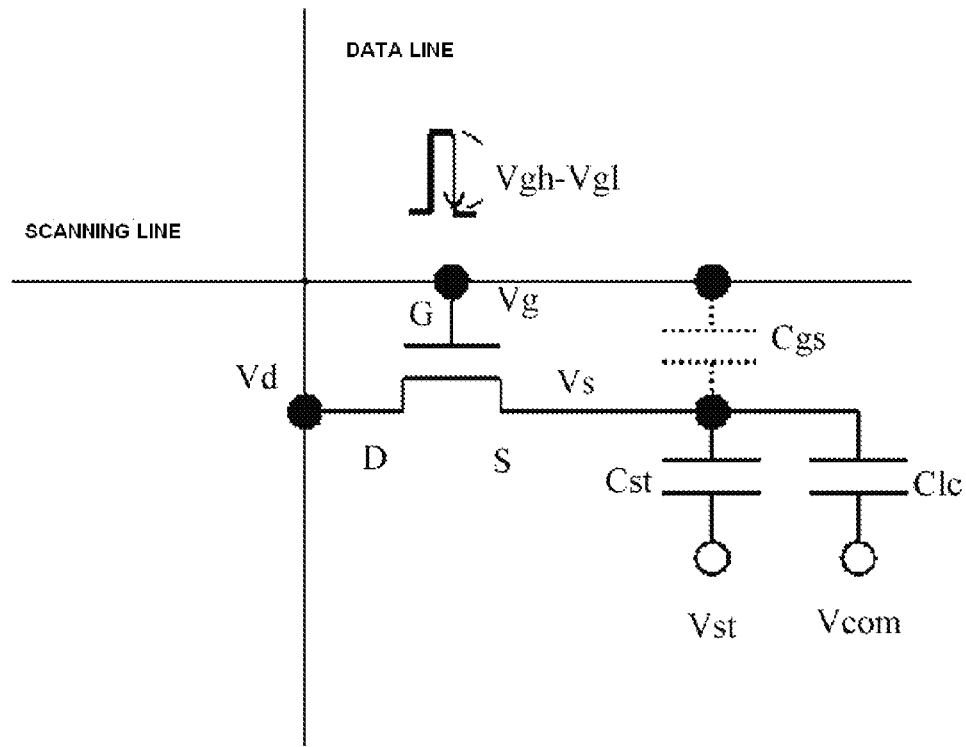
FIG. 3 is an equivalent circuit diagram of a pixel structure of the array substrate.

$C_{all}$ is a sum of capacitance of a circuit in FIG. 3 (i.e., an equivalent capacitance), $V_{gh}$ and $V_{gl}$ are voltages of the gate electrode at high and low levels. The farther the thin film transistor is away from the gate driver side of the array substrate, the more likely the overlapping area between the active layer and the source electrode of the thin film transistor shows an increasing trend, and the active layer is typically made of semiconductor material (e.g., an oxide semiconductor; typically, a gate electrode and a source electrode are spaced by a gate insulating layer and an active layer, and a dielectric constant of the oxide active layer is greater than that of the gate insulating layer), so an average dielectric constant ∈ between the gate electrode and the source electrode will increase and $C_{gs}$ increases, so that ΔVp increases. That is, as going farther away from the gate driver side of the array substrate, ΔVp of pixel shows a tendency to increase. Therefore, according to Vcom=V−ΔVp, an increase of ΔVp leads to a decreasing trend of the common electrode voltage Vcom farther away from the gate driver side of the array substrate, which will improve the phenomenon of an increasing trend of the common electrode voltage Vcom farther away from the gate driver side of the array substrate in FIG. 1. That is, by improving ΔVp, the curve in FIG. 1 tends to be horizontal, so that Vcom tends to be stable. "A decreasing trend" refers to an overlapping area between an active layer and a drain electrode of a thin film transistor in a pixel unit farther away from the gate driver side of the array substrate is less than or equal to an overlapping area between an active layer and a drain electrode of a thin film transistor in a pixel unit closer to the gate driver side of the array substrate, and an overlapping area between an active layer and a drain electrode of a thin film transistor in at least one pixel unit is less than an overlapping area between an active layer and a drain electrode of a thin film transistor in a pixel unit which is closer to the gate driver side than the at least one pixel unit.

In order to facilitate production and layout of the array substrate, the pixel units are divided into n groups by columns, where 1<n≤N, and N is a total number of columns; from a first column of pixels near the gate driver side of the array substrate, an overlapping area between an active layer and a source electrode of a thin film transistor in a $(i+1)^{th}$ group of pixel units is greater than an overlapping area between an active layer and a source electrode of a thin film transistor in a $i^{th}$ group of pixel units by $\Delta S_i$, where 1≤i≤n−1; and overlapping areas between active layers and source electrodes of thin film transistors in the same group are equal. Preferably, the respective groups of pixel units have the same number of columns.

Figure 4:
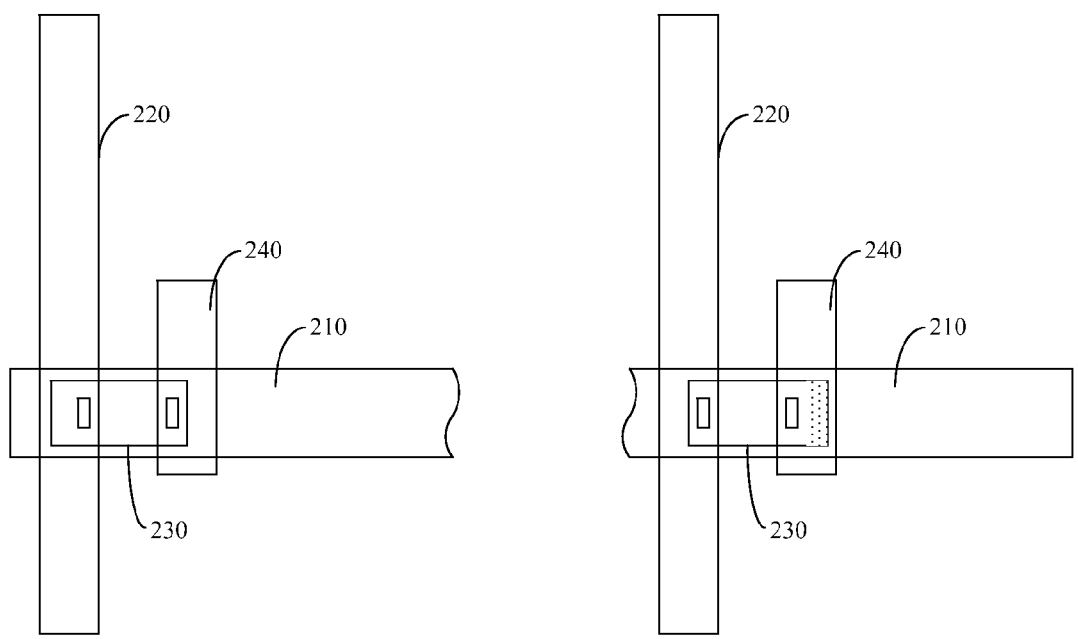
FIG. 4 is a structural schematic diagram of another array substrate according to an embodiment of the present invention.

Further, as illustrated in FIG. 4, while a right end of the active layer 230 (an end overlapping with the source electrode 240) is enlarged, a capacitance can be changed by decreasing an overlapping area between a left end of the active layer 230 (an end overlapping with the drain electrode; the drain electrode and the data line 220 in FIG. 2 are integrally designed) and the drain electrode. Because an area of the active layer between the gate electrode and the drain electrode decreases, the dielectric constant ∈ therebetween decreases, so that the capacitance between the gate electrode and the drain electrode decreases, and $C_{all}$ in the formula (1) decreases and thus ΔVp increases.

Similarly, to facilitate the production and layout of the array substrate, the pixel units are divided into m groups by columns, where 1<m≤N, and N is a total number of columns; from a first column of pixels near the gate driver side of the array substrate, an overlapping area between an active layer of a thin film transistor in a $(j+1)^{th}$ group of pixel units and the data line (since the data line and the drain electrode of the thin film transistor are formed integrally, here the data line can be, for example, a part serving as the drain electrode of the thin film transistor) is less than an overlapping area between an active layer of a thin film transistor in a $j^{th}$ group of pixel units and the data line by $\Delta S_j$, where 1≤j≤m−1; and overlapping areas between active layers of thin film transistors and the data line in the same group are equal. Preferably, the respective groups of pixel units have the same number of columns, and m=n.

While the overlapping area with the source electrode increases on the right end of the active layer, the overlapping area with the drain electrode decreases on the left end of the active layer, which can be understood as compared with the prior art, the entire active layer is displaced to the right, that is, the active layer moves a little distance to the right without any change in size, at this circumstance, when m=n and i=j, $\Delta S_i = \Delta S_j$.

It should be noted that the pixel units in each row of pixel units all have the rules of "an increasing trend" and "a decreasing trend" mentioned above. However, in each column of pixels, overlapping areas between active layers and source electrodes of respective pixel units are equal and/or overlapping areas between active layers and drain electrodes of respective pixel units are equal.

The above embodiments are only intended to be illustrative rather than limitative of the present invention. Those of ordinary skill in the art can, without departing from the spirit and the scope of the present invention, make various changes and modifications. Therefore, all equivalent technical solutions are also within the scope of the present invention, and the patent scope of the invention should be defined by the appended claims.

The foregoing embodiments merely are exemplary embodiments of the invention, and not intended to define the scope of the invention, and the scope of the invention is determined by the appended claims.

The present application claims priority of Chinese Patent Application No. 201410208869.5 filed on May 16, 2014, the disclosure of which is incorporated herein by reference in its entirety as part of the present application.

What is claimed is:

1. An array substrate, comprising a gate line, a data line and a plurality of pixel units defined by the gate line and the data line intersecting with each other, which are formed on a base substrate, and each pixel unit comprising a thin film transistor, wherein, the farther the thin film transistor is away from a gate driver side of the array substrate, an overlapping area between an active layer and a source electrode of the thin film transistor shows an increasing trend, the pixel units are divided into n groups by columns, where $1 < n \leq N$, and N is a total number of columns; from a first column of pixels near the gate driver side of the array substrate, an overlapping area between an active layer and a source electrode of a thin film transistor in a $(i+1)^{th}$ group of pixel units is greater than an overlapping area between an active layer and a source electrode of a thin film transistor in a $i^{th}$ group of pixel units by $\Delta S_i$, where $1 \leq i \leq n-1$; and overlapping areas between active layers and source electrodes of thin film transistors in a same group are equal.

2. The array substrate according to claim 1, wherein, respective groups of pixel units have a same number of columns.

3. The array substrate according to claim 2, wherein, the farther the thin film transistor is away from the gate driver side of the array substrate, an overlapping area between an active layer and a drain electrode of a thin film transistor shows a decreasing trend.

4. The array substrate according to claim 3, wherein, the pixel units are divided into m groups by columns, where $1 < m \leq N$, and N is a total number of columns; from a first column of pixels near the gate driver side of the array substrate, an overlapping area between an active layer of a thin film transistor in a $(j+1)^{th}$ group of pixel units and the data line is less than an overlapping area between an active layer of a thin film transistor in a $j^{th}$ group of pixel units and the data line by $\Delta S_j$, where $1 \leq j \leq m-1$; and overlapping areas between active layers of thin film transistors and the data line in a same group are equal.

5. The array substrate according to claim 4, wherein, respective groups of pixel units have a same number of columns.

6. The array substrate according to claim 4, wherein, m=n.

7. The array substrate according to claim 6, wherein, when i=j, $\Delta S_i = \Delta S_j$.

8. The array substrate according to claim 1, wherein, the active layer has a material of oxide semiconductor.

9. A display device, comprising an array substrate, the array substrate comprising a gate line, a data line and a plurality of pixel units defined by the gate line and the data line intersecting with each other, which are formed on a base substrate, and each pixel unit including a thin film transistor, wherein, the farther the thin film transistor is away from a gate driver side of the array substrate, an overlapping area between an active layer and a source electrode of the thin film transistor shows an increasing trend, the pixel units are divided into n groups by columns, where $1 < n \leq N$, and N is a total number of columns; from a first column of pixels near the gate driver side of the array substrate, an overlapping area between an active layer and a source electrode of a thin film transistor in a $(i+1)^{th}$ group of pixel units is greater than an overlapping area between an active layer and a source electrode of a thin film transistor in a $i^{th}$ group of pixel units by $\Delta S_i$, where $1 \leq i \leq n-1$; and overlapping areas between active layers and source electrodes of thin film transistors in a same group are equal.

* * * * *